United States Patent
Onderlička et al.

(10) Patent No.: US 11,264,200 B1
(45) Date of Patent: Mar. 1, 2022

(54) LAMELLA ALIGNMENT BASED ON A RECONSTRUCTED VOLUME

(71) Applicant: FEI Company, Hillsboro, OR (US)

(72) Inventors: Tomáš Onderlička, Brno (CZ); Jaroslav Stárek, Brno (CZ); Lukáš Hübner, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/029,981

(22) Filed: Sep. 23, 2020

(51) Int. Cl.
   *H01J 37/22* (2006.01)
   *H01J 37/26* (2006.01)
   *G06T 7/70* (2017.01)
   *G06T 11/00* (2006.01)
   *G01N 1/28* (2006.01)

(52) U.S. Cl.
   CPC .......... *H01J 37/222* (2013.01); *G01N 1/286* (2013.01); *G06T 7/70* (2017.01); *G06T 11/006* (2013.01); *H01J 37/26* (2013.01); *G01N 2001/2873* (2013.01); *G06T 2207/10061* (2013.01); *H01J 2237/221* (2013.01); *H01J 2237/226* (2013.01)

(58) Field of Classification Search
   CPC .... H01J 37/222; H01J 37/26; H01J 2237/221; H01J 2237/226; G06T 7/70; G06T 11/006; G06T 2207/10061; G01N 1/286; G01N 2001/2873

USPC ............ 250/306, 307, 309, 310, 311, 492.1, 250/492.3

See application file for complete search history.

(56) References Cited

U.S. PATENT DOCUMENTS

| 4,758,723 A | * | 7/1988 | Wardell | H01J 49/46 250/305 |
| 2016/0050750 A1 | * | 2/2016 | Rogers | H05K 3/285 361/767 |
| 2020/0150054 A1 | * | 5/2020 | Leong | G01N 21/8806 |

* cited by examiner

*Primary Examiner* — Nicole M Ippolito

(57) ABSTRACT

Apparatuses and methods for aligning lamella to charged particle beams based on a volume reconstruction are disclosed herein. An example method at least includes forming a reconstructed volume of a portion of a sample, the sample including a plurality of structures, and the reconstructed volume including a portion of the plurality of structures, performing, over a range of angles, a mathematical transform on each plane of a plurality of planes of the reconstructed volume, and based on the mathematical transform on each plane of the plurality of planes, determining a target orientation of the sample within the range of angles, wherein the target orientation aligns the plurality of structures parallel to an optical axis of a charged particle beam.

20 Claims, 7 Drawing Sheets

301

303

```
Form a reconstructed volume of a portion of a sample, the
sample including a plurality of structures, and the
reconstructed volume including a portion of the plurality of
structures

603
```

↓

```
Perform, over a range of angles, a mathematical transform on
each plane of a plurality of planes of the reconstructed
volume

605
```

↓

```
Based on the mathematical transform on each plane of the
plurality of planes, determine a target orientation of the
sample within the range of angles, wherein the target
orientation aligns the plurality of structures parallel to an
optical axis of a charged particle beam

LAMELLA ALIGNMENT BASED ON A RECONSTRUCTED VOLUME

FIELD OF THE INVENTION

The invention relates generally to charged particle microscopy, and more specifically to techniques for aligning samples to an optical axis of a charged particle microscope.

BACKGROUND OF THE INVENTION

In many industries, samples are analyzed using various charged particle microscopes, such as transmission electron microscopes (TEM). However, to view samples in a TEM, lamella are formed from the sample with the lamella including specific structures/objects that are desired to be imaged in the TEM. In general, a lamella is a thin membrane that is at least partially electron transparent, and can have a thickness of 7 nm to 25 nm, and sometimes more. At such small dimensions, it is easy to remove the specific structures/objects of a study during lamella formation, especially when many lamella formation steps are manually performed. While there are some techniques available to address this issue, many of the techniques are still lacking in overall satisfaction and require highly skilled operators to either perform them or monitor them. As such, better techniques to align structures within the lamella to ensure those structures are not removed during lamella formation are desired.

SUMMARY

Apparatuses and methods for aligning lamella to charged particle beams based on a volume reconstruction are disclosed herein. An example method at least includes forming a reconstructed volume of a portion of a sample, the sample including a plurality of structures, and the reconstructed volume including a portion of the plurality of structures, performing, over a range of angles, a mathematical transform on each plane of a plurality of planes of the reconstructed volume, and based on the mathematical transform on each plane of the plurality of planes, determining a target orientation of the sample within the range of angles, wherein the target orientation aligns the plurality of structures parallel to an optical axis of a charged particle beam.

An example apparatus at least includes a focused ion beam column coupled to provide an ion beam along an optical axis; an electron beam column coupled to provide an electron beam; and a controller coupled to or including non-transitory memory including code. When the code is executed by the controller, the controller causes the apparatus to form, using a combination of the ion beam and the electron beam, a reconstructed volume of a portion of a sample, the sample including a plurality of structures, and the reconstructed volume including a portion of the plurality of structures, perform, over a range of angles, a mathematical transform on each plane of a plurality of planes of the reconstructed volume; and based on the mathematical transform on each plane of the plurality of planes, determine a target orientation of the sample within the range of angles, wherein the target orientation aligns the plurality of structures parallel to an optical axis of a charged particle beam.

BRIEF DESCRIPTION OF THE DRAWINGS

FIG. 6 is an example method for determining an optimal orientation of a sample in accordance with an embodiment of the present disclosure.

Like reference numerals refer to corresponding parts throughout the several views of the drawings.

DETAILED DESCRIPTION OF EMBODIMENTS

Figure 1:
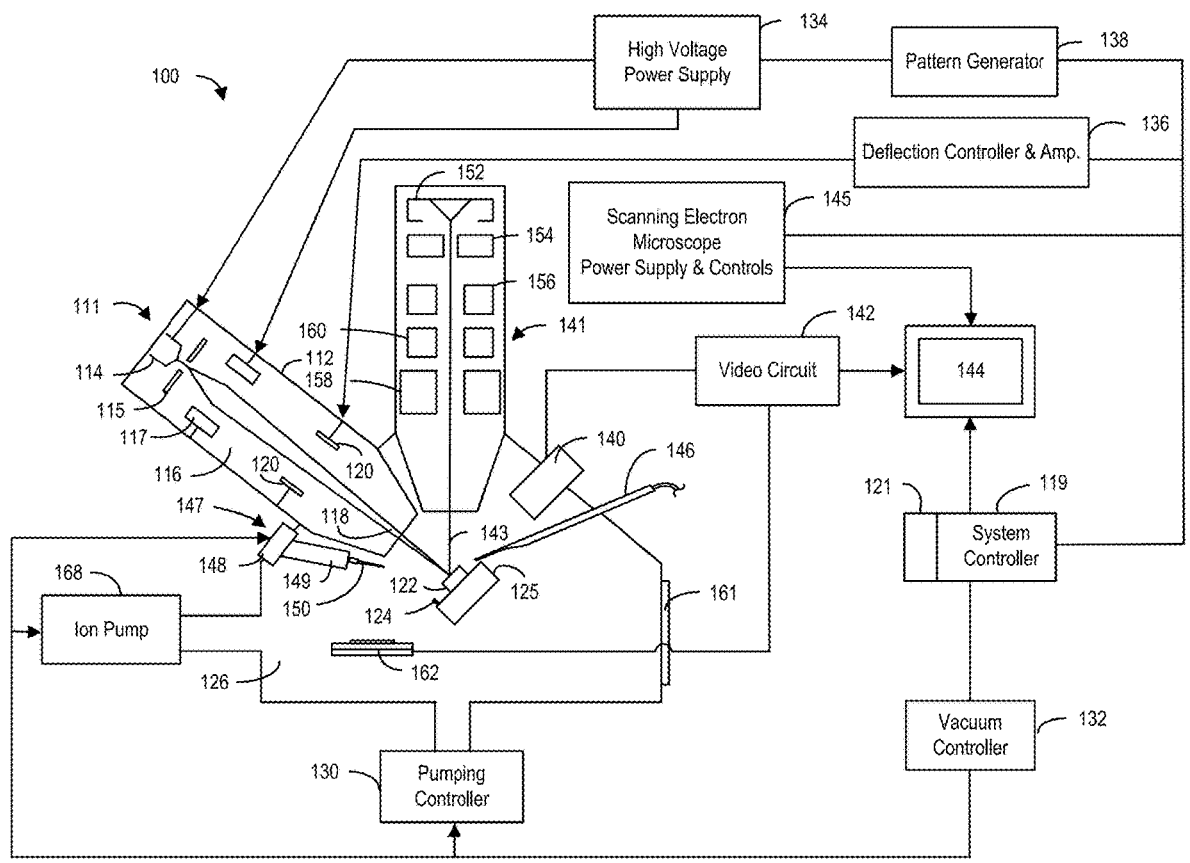
FIG. 1 is an example dual beam system for determining an orientation of a sample and adjusting the orientation in accordance with an embodiment of the present disclosure.

Embodiments of the present invention are described below in the context of a charged particle beam system implementing a technique to determine an optimum orientation of a sample for lamella formation. For example, a portion of a sample is removed in a dual beam system using a slice-and-view method to form a reconstructed volume, which provides planes for radon transformation over a range of angles. The radon transformations over the range of angles is then statistically analyzed to determine the optimum orientation of the sample with respect to a focused ion beam axis of the dual beam system. However, it should be understood that the techniques described herein are generally applicable to a wide range of different sample orientation methods and apparatus.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

In many industries that require analysis of micron or nanometer sized objects, such as the semiconductor industry, charged particle microscopy is used to view and analyze such objects. Acquired images are used for yield enhancement or process control, for example, in the semiconductor industry. In many, if not all, instances, the objects are buried within a larger component, such as field effect transistors (FETs) formed within a silicon wafer. If one or more adjacent FETs are desired to be imaged with a charged particle microscope, such as transmission electron microscope (TEM), scanning TEM (STEM), or related technology, a lamella is formed and removed from the wafer, which will include the structures forming the FET, typically with a dual beam (DB) system that is a combination of a scanning electron microscope (SEM) and a focused ion beam (FIB). This process has become conventional in many industries, not just the semiconductor industry, and is used to image and analyze almost any type of micron or nanometer scale structure buried within a surrounding substrate.

While this process has been used in industry for some years now, the ever shrinking sizes of devices, e.g., FETs and other connecting circuitry, and their spacing makes the formation of the lamella more error prone. For example, if the sample is out of alignment or orientation with the FIB optical axis during lamella formation, structures desired for imaging may be inadvertently removed, e.g., milled away, from the lamella. For devices of 2 nm within a 7 nm lamella, it is critical to maintain the required orientation because the loss of desired structures can easily occur. This is the case because lamella of such small thicknesses are overly acceptable to deformation which affects where the desired structures within the lamella are located in relation to the surfaces of the lamella. To ensure the desired devices are within the lamella, and more importantly aligned with the optical axis of the FIB column, the conventional approach is to manually examine images during lamella thinning and move, e.g., reorient, the lamella when the structures are deemed out of position. Such movement of the lamella can include rotation, tilt, lateral offset, and combinations thereof. While a highly skilled operator may be able to perform such analysis and manipulation, such reorientation is time consuming yet still prone to errors. As such, a more automated technique for structure alignment to the FIB column optical axis is desired.

One solution includes virtually orienting one or more planes/slices of a reconstructed volume of a portion of a sample in a range of different orientations and analyzing the data to determine the optimum location of the lamella to ensure the device structures are parallel with the FIB column optical axis. The different orientations can include rotation of the sample around the FIB optical axis, tilt of the sample within the plane of the FIB optical axis, or a combination thereof. While translation of the sample in the X, Y, and Z coordinates is also possible, other techniques can address such misplacement. The virtual orientation of the reconstructed volume, or at least a number of planes within the reconstructed volume, include performing a integral transform, such as a radon transform, to project each plane at a number of different angles. Each projection, which may also be a one-dimensional function/projection of that plane, may be statistically analyzed for variation of amplitude, such as through the use of standard deviation or variance. This data may then be analyzed over each projection and each angle to determine a maximum value, which may determine the optimum angle to orient the lamella. The optimum angle information may then be used to automatically reorient the lamella for further processing.

FIG. 1 is an example dual beam system 100 for determining an orientation of a sample and adjusting the orientation in accordance with an embodiment of the present disclosure. System 100 may be used to implement the sample orientation techniques discussed herein. In some embodiments, the system 100 will perform the sample milling, orientation algorithms and sample orientation. However, in other embodiments, the orientation algorithms may be performed by a computing system coupled to system 100, such as at a user's desk or a cloud based computing system. In either embodiment, the determination of optimum orientation may be provided to system 100 for automatic sample reorientation to ensure structures within the sample are parallel with a FIB optical axis. While an example of suitable hardware is provided below, the invention is not limited to being implemented in any particular type of hardware.

An SEM 141, along with power supply and control unit 145, is provided with the dual beam system 100. An electron beam 143 is emitted from a cathode 152 by applying voltage between cathode 152 and an anode 154. Electron beam 143 is focused to a fine spot by means of a condensing lens 156 and an objective lens 158. Electron beam 143 is scanned two-dimensionally on the specimen by means of a deflector 160. Operation of condensing lens 156, objective lens 158, and deflector 160 is controlled by power supply and control unit 145.

Electron beam 143 can be focused onto substrate 122, which is on stage 125 within lower chamber 126. Substrate 122 may be located on a surface of stage 125 or on TEM sample holder 124, which extends from the surface of stage 125.

When the electrons in the electron beam strike substrate 122, secondary electrons are emitted. These secondary electrons are detected by secondary electron detector 140. In some embodiments, STEM detector 162, located beneath the TEM sample holder 124 and the stage 125 collects electrons that are transmitted through the sample mounted on the TEM sample holder.

System 100 also includes FIB system 111 which comprises an evacuated chamber having an ion column 112 within which are located an ion source 114 and focusing components 116 including extractor electrodes and an electrostatic optical system. The axis of focusing column 116 may be tilted, 52 degrees for example, from the axis of the electron column 141. The ion column 112 includes an ion source 114, an extraction electrode 115, a focusing element 117, deflection elements 120, which operate in concert to form focused ion beam 118. Focused ion beam 118 passes from ion source 114 through focusing components 116 and between electrostatic deflection means schematically indicated at 120 toward substrate 122, which may comprise, for example, a semiconductor wafer positioned on movable stage 125 within lower chamber 126. In some embodiments, a sample may be located on TEM grid holder 124, where the sample may be a chunk extracted from substrate 122. The chunk may then undergo further processing with the FIB to form a final lamella of a desired thickness in accordance with techniques disclosed herein.

Stage 125 can move in a horizontal plane (X and Y axes) and vertically (Z axis). Stage 125 can also tilt and rotate about the Z axis. In some embodiments, a separate TEM sample stage 124 can be used. Such a TEM sample stage will also preferably be moveable in the X, Y, and Z axes as well as tiltable and rotatable. In some embodiments, the tilting of the stage 125/TEM holder 124 may be in and out of the plane of the ion beam 118, and the rotating of the stage is around the ion beam 118. As used herein to illustrate the disclosed techniques, such relationship will be maintained when discussing rotation and tilting of a sample. Of course, the opposite definitions could be used but would still fall within the contours of the present disclosure.

A door 161 is opened for inserting substrate 122 onto stage 125. Depending on the tilt of the stage 124/125, the Z axis will be in the direction of the optical axis of the relevant column. For example, during a data gathering stage of the disclosed techniques, the Z axis will be in the direction, e.g., parallel with, the FIB optical axis as indicated by the ion beam 118. In such a coordinate system, the X and Y axis will be referenced from the Z-axis. For example, the X-axis may be in and out of the page showing FIG. 1, whereas the Y-axis will be in the page, all while all three axes maintain their perpendicular nature to one another.

An ion pump 168 is employed for evacuating neck portion 112. The chamber 126 is evacuated with turbomolecular and mechanical pumping system 130 under the control of vacuum controller 132. The vacuum system provides within chamber 126 a vacuum of between approximately $1\times10^{-7}$ Torr and $5\times10^{-4}$ Torr. If an etch assisting, an etch retarding gas, or a deposition precursor gas is used, the chamber background pressure may rise, typically to about $1\times10^{-5}$ Torr.

The high voltage power supply provides an appropriate acceleration voltage to electrodes in focusing column 116 for energizing and focusing ion beam 118. When it strikes substrate 122, material is sputtered, that is physically ejected, from the sample. Alternatively, ion beam 118 can decompose a precursor gas to deposit a material.

High voltage power supply 134 is connected to ion source 114 as well as to appropriate electrodes in ion beam focusing components 116 for forming an approximately 1 keV to 60 keV ion beam 118 and directing the same toward a sample. Deflection controller and amplifier 136, operated in accordance with a prescribed pattern provided by pattern generator 138, is coupled to deflection plates 120 whereby ion beam 118 may be controlled manually or automatically to trace out a corresponding pattern on the upper surface of substrate 122. In some systems the deflection plates are placed before the final lens, as is well known in the art. Beam blanking electrodes (not shown) within ion beam focusing column 116 cause ion beam 118 to impact onto blanking aperture (not shown) instead of substrate 122 when a blanking controller (not shown) applies a blanking voltage to the blanking electrode.

The ion source 114 typically provides an ion beam based on the type of ion source. In some embodiments, the ion source 114 is a liquid metal ion source that can provide a gallium ion beam, for example. In other embodiments, the ion source 114 may be plasma-type ion source that can deliver a number of different ion species, such as oxygen, xenon, and nitrogen, to name a few. The ion source 114 typically is capable of being focused into a sub one-tenth micrometer wide beam at substrate 122 or TEM grid holder 124 for either modifying the substrate 122 by ion milling, ion-induced etching, material deposition, or for the purpose of imaging the substrate 122.

A charged particle detector 140, such as an Everhart Thornley or multi-channel plate, used for detecting secondary ion or electron emission is connected to a video circuit 142 that supplies drive signals to video monitor 144 and receiving deflection signals from a system controller 119. The location of charged particle detector 140 within lower chamber 126 can vary in different embodiments. For example, a charged particle detector 140 can be coaxial with the ion beam and include a hole for allowing the ion beam to pass. In other embodiments, secondary particles can be collected through a final lens and then diverted off axis for collection.

A micromanipulator 147 can precisely move objects within the vacuum chamber. Micromanipulator 147 may comprise precision electric motors 148 positioned outside the vacuum chamber to provide X, Y, Z, and theta control of a portion 149 positioned within the vacuum chamber. The micromanipulator 147 can be fitted with different end effectors for manipulating small objects. In the embodiments described herein, the end effector is a thin probe 150.

A gas delivery system 146 extends into lower chamber 126 for introducing and directing a gaseous vapor toward substrate 122. For example, iodine can be delivered to enhance etching, or a metal organic compound can be delivered to deposit a metal.

System controller 119 controls the operations of the various parts of dual beam system 110. Through system controller 119, a user can cause ion beam 118 or electron beam 143 to be scanned in a desired manner through commands entered into a conventional user interface (not shown). Alternatively, system controller 119 may control dual beam system 110 in accordance with programmed instructions stored in a memory 121. In some embodiments, dual beam system 110 incorporates image recognition software to automatically identify regions of interest, and then the system can manually or automatically extract samples in accordance with the invention. For example, the system could automatically locate similar features on semiconductor wafers including multiple devices, and take samples of those features on different (or the same) devices.

In operation in accordance with the techniques disclosed herein, system 100 images a working surface of a sample 122, the sample 122 being a chunk previously removed from a substrate. The chunk, which may be about 1 micron in thickness, may be attached to TEM holder 124 in this example. As used herein, the working surface is a side surface of the chunk, the chunk needing to be thinned into a final lamella thickness. The sample 122 may include structures that should be aligned/oriented to the ion beam 118, such as in terms of rotation and/or tilt, so that during the final lamella formation, structures that require subsequent imaging are not removed. The image of the newly exposed surface can be acquired using either the electron column 141 or the FIB 111.

After image acquisition, a layer of sample 122 is removed from the working surface. The removal of the layer, or slice, may be performed using FIB milling or ion induced etching using a gas precursor. The removed layer may be, for example, 2 to 5 nanometers in thickness. After the slice is removed, the newly exposed surface is imaged. The process of image acquisition and slice removal may be repeated for 25, 50, 75, or 100 times, but any other number of slices are contemplated herein. In general, a small portion of the sample 122, e.g., a small volume of the chunk, is removed that includes 2 or more lines of structures, such as FETs, which allow analysis of orientation of the structures with respect to the ion beam 118. This process may be known as slice-and-view to those of skill in the art, and can be used to acquire data to reconstruct a 3D volume of sample 122.

The 3D reconstructed volume may then be used as the basis for determination of the optimum orientation, e.g., rotation and tilt, of sample 122 to ensure the buried structures are parallel to the ion beam 118. In terms of coordinates, the Z-direction of the reconstructed volume is in the direction of the removed slices, and the X and Y directions are in the plane of those slices. To determine the optimum orientation, a plurality of planes in either the XZ or YZ plane of the reconstructed volume are subject to an integral transform, such as a radon transform, to assist the orientation determination. For example, each plane is virtually rotated to a number of different angles within a range around the current orientation of the sample 122, such as from −1.5° to +1.5° and a respective transform is obtained at each angle. Alternatively, each plane of the plurality of planes are mathematically transformed at a different angle within the range of angles. Of course, a single plane may be extracted from the volume and subject to the mathematical transform at the different angles, but the statistical relevance of such data may not be sufficient.

Each transform may then be statistically characterized. For example, a standard deviation or variance may be computed for each transform. Subsequently, the statistical data of each transform may then be evaluated to determine the optimum orientation. For example, a maximum standard deviation value, or interpolation based on an associated plot, may indicate the optimum orientation, e.g., rotation and/or tilt, for the sample 122 to ensure the buried structures are aligned as needed. This optimum orientation may then be relayed back to the control system 119, for example, so that the stage 125 is automatically reoriented based on the analysis.

Figure 2:
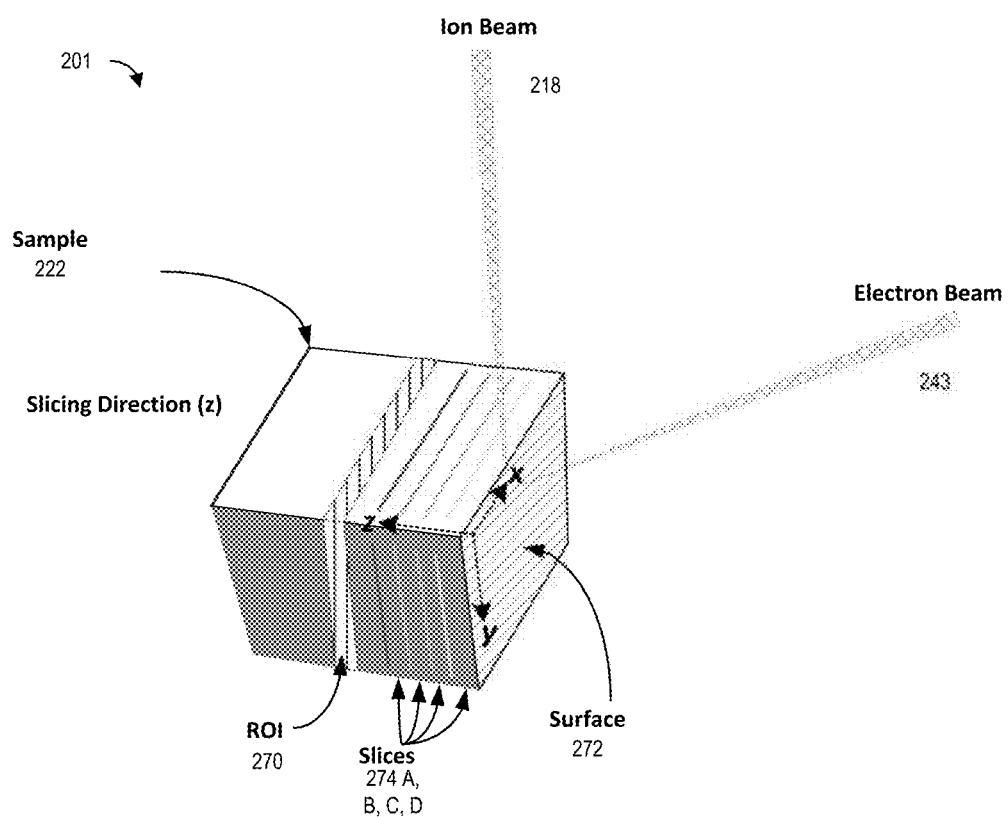
FIG. 2 is an example sample processing workflow in accordance with an embodiment of the present disclosure.

FIG. 2 is an example sample processing workflow 201 in accordance with an embodiment of the present disclosure. The workflow 201 illustrates a sample milling and imaging technique that can also be referred to as slice-and-view. In the disclosed technique, slice-and-view is used to obtain data on the sample to inform desired orientation with respect to a working charged particle beam, such as an ion beam. The workflow 201 may be performed by a dual beam charged particle microscope, such as system 100 for example, and is more directed to the data gathering aspect of the disclosed techniques. The analysis aspects will be discussed in more detail below.

The workflow 201 is performed on sample 222, which is an example of sample 122, and which may be mounted on a stage, such as stage 125, or mounted on a TEM grid hold, such as TEM grid holder 124. In either mounting configuration, sample 222 may be a chunk of a larger sample, such as a patterned wafer or a packaged IC, and includes a region of interest (ROI) 270. ROI 270 may include one or more lines or rows of structures, such a FET structures, desired to be analyzed by subsequent imaging techniques, such as TEM or STEM. Imaging such structures may require their extraction from sample 222 in the form of a lamella. However, to extract such structures, sample 222 is processed to form the lamella that mainly includes ROI 270, which includes removing the volume of sample 222 surrounding ROI 270, at least in the Z direction. In some examples, sample 222 may be around 1 micron in thickness, in the Z direction in this example, but a lamella with thickness from 7 to 25 nanometers is desired for the TEM/STEM analysis. As such, the volume of sample 222 surrounding ROI 270 in the Z direction needs to be removed. However, if the sample 222, or more importantly the structures within the sample 222, are not aligned parallel to the working charged particle beam, the ion beam 218 in this example, there is a chance the structures desired to be imaged may be removed in the lamella formation process. As such, the disclosed orientation techniques acquire data regarding the orientation of the structures during early stages of lamella formation that allows adjustments to be made to the orientation of the structures to the ion beam 218 to limit or prevent such removal of the desired structures.

To that end, workflow 201 uses ion beam 218 to remove material from sample 222 and images newly exposed surfaces 272 with electron beam 243. A newly exposed surface 272 will be formed after the removal of each slice of sample 222. For example, ion beam 218 removes slice 274A exposing a new surface 272. The removal of slice 274A, and subsequent slices, can be performed by milling the slice away using the ion beam 218, or it can be removed using ion beam induced etching by bleeding a gas precursor to the surface 272, which then etches away the slice through interaction with the ion beam 218. Each slice may be on the order of 2 to 5 nanometers in thickness, but the size of the structures within sample 222 may determine the desired slice thickness. For example, smaller structures may require thinner slices, whereas larger structures can stand thicker slices. As the workflow progresses, slice 274B is removed then an image of the newly exposed surface 272 is acquired. This two-step process may then repeat for the removal of slices 247C and 274D.

The workflow 201 may only remove or use a relatively small volume of sample 222 to determine the orientation of the structures and how to adjust the orientation so that the structures are parallel to the ion beam 218. For example, 50 to 100 nanometers of material may be removed from sample 222 to perform the analysis disclosed herein. In general, the thickness of sample 222 needed for the disclosed techniques may depend on the number of lines/structures removed and whether the amount of resulting data is enough to satisfy the analysis. For example, three lines of structures may be enough to implement the disclosed techniques. The reorientation may include rotation around the y-axis, tile around the x-axis, and/or translation in any direction.

Figure 3A:
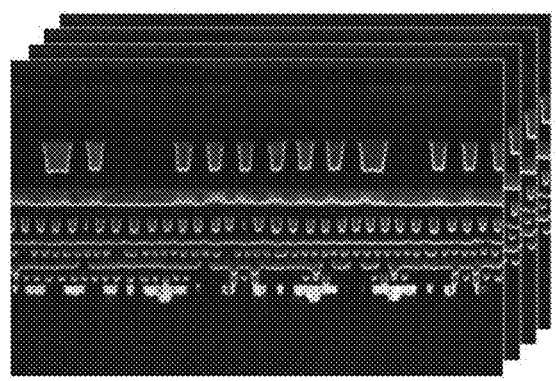
FIG. 3A is an example series of images in accordance with an embodiment of the present disclosure.
Figure 3B:
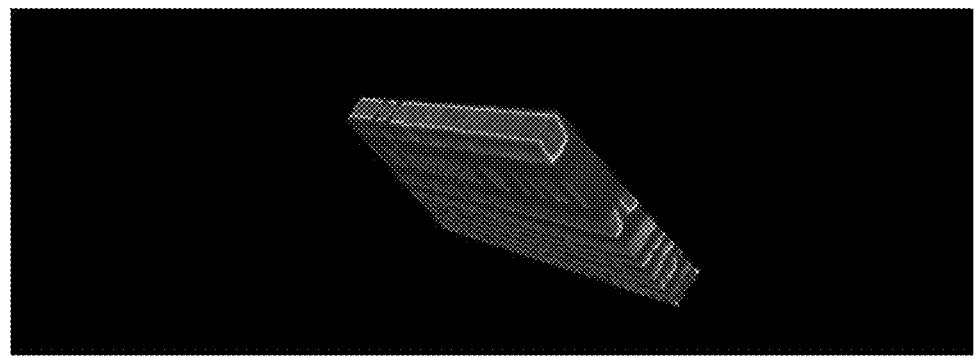
FIG. 3B is an example reconstructed volume in accordance with an embodiment of the present disclosure.

FIG. 3A is an example series of images 301 in accordance with an embodiment of the present disclosure. The series of images 301 show four images, but that number is merely for illustration, and the actual number of images may be similar or much larger in number, such as 50 to 100. The images 301 may be acquired by system 100, such as by implementing the workflow 201. FIG. 3B is an example reconstructed volume 303 in accordance with an embodiment of the present disclosure. The reconstructed volume 303 is formed from the series of images 301, which are representative of the structures in the sample, such as sample 222, and how they are oriented with respect to the ion beam at least while the data is collected.

Figure 3C:
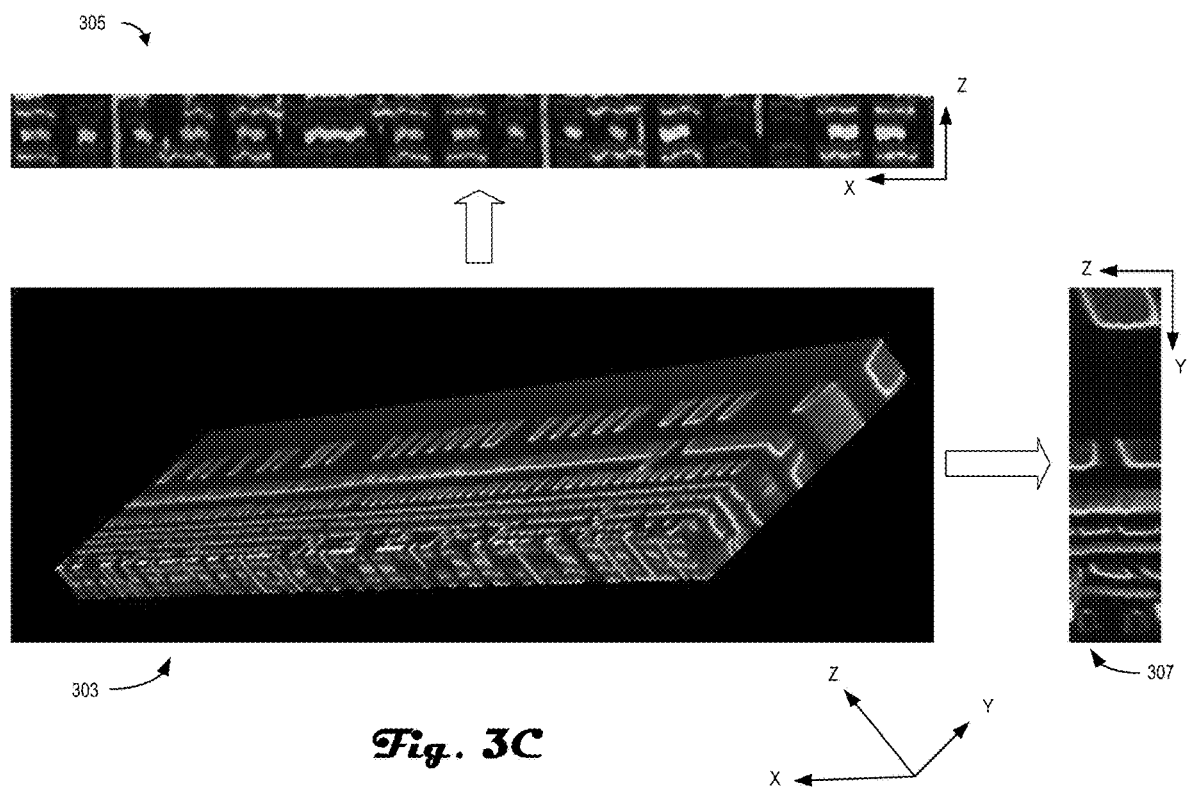
FIG. 3C shows example planes or cross-sections of reconstructed volume 303 in accordance with an embodiment of the present disclosure.

FIG. 3C shows example planes or cross-sections 305 and 307 of reconstructed volume 303 in accordance with an embodiment of the present disclosure. The plane 305 is a cross-section in the XZ plane, see orientation axis below reconstructed volume 303, and plane 307 is a cross-section in the YZ plane. The disclosed technique uses a plurality of planes from the XZ plane to determine rational orientation, around the ion beam axis, for example, and/or the technique uses a plurality of planes from the YZ plane to determine tilt orientation in and out of the ion beam axis, for example.

Figure 4A:
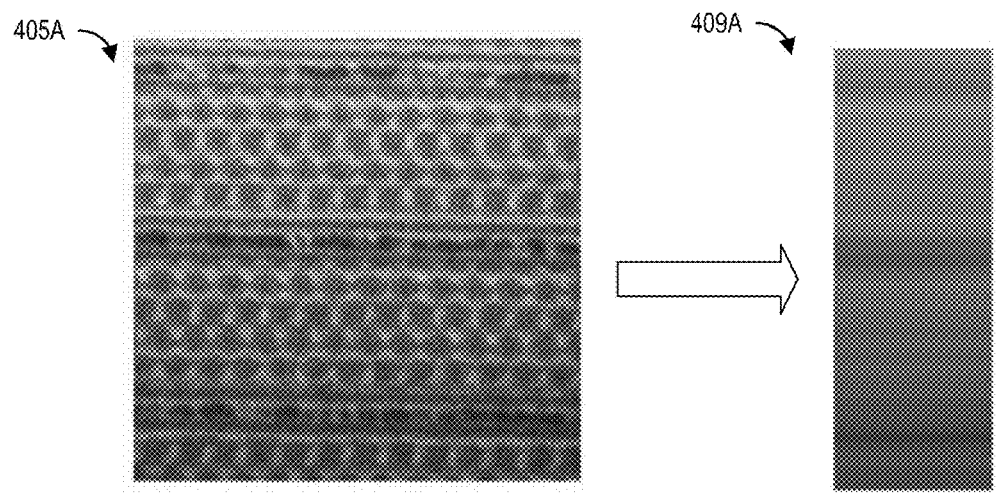
FIG. 4A is a representative plane and associated integral transform 409A in accordance with an embodiment of the present disclosure.

FIG. 4A is a representative plane 405A and associated integral transform 409A in accordance with an embodiment of the present disclosure. The plane 405A illustrates an XZ plane of a volume reconstruction, such as reconstruction 303. The plane 405A is an illustration of such a plane at a non-ideal orientation. For example, the structures shows in the plane 405A are slightly angled downward in the image. As a result, the integral transform 409A, which may be obtained using a Radon Transform, for example, shows a blurry image. While the integral transform 409A is represented with a 2D image, one skilled in the art will understand that the Integral transform will result in a vector. The 2D image is used for illustration only. The blurriness of integral transform 409A indicates that the orientation of the plane 405A is not as desired. As such, a different, rotational or tilt orientation is desired.

Figure 4B:
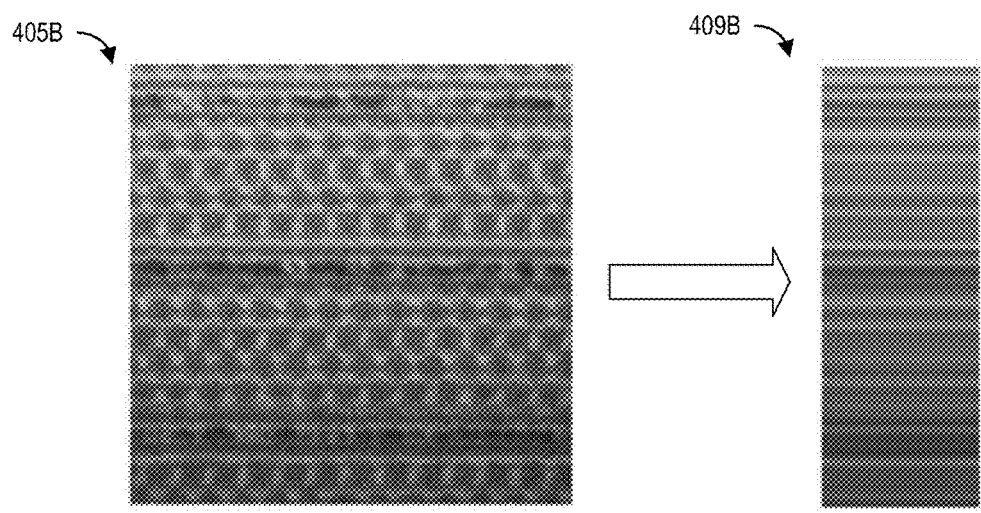
FIG. 4B is representative plane and associated integral transform 409B in accordance with an embodiment of the present disclosure.

FIG. 4B is representative plane 405B and associated integral transform 409B in accordance with an embodiment of the present disclosure. The plane 405B illustrates an XZ plane of the same volume reconstruction as in 405A, but in an ideal orientation. This is shown, at least visually, in integral transform 409B, as indicated by the relative clearness of individual striations in 409B. As such, the angle associated with integral transform 409B may indicate or be very close to the optimum orientation of a sample the images represent.

Figure 5:
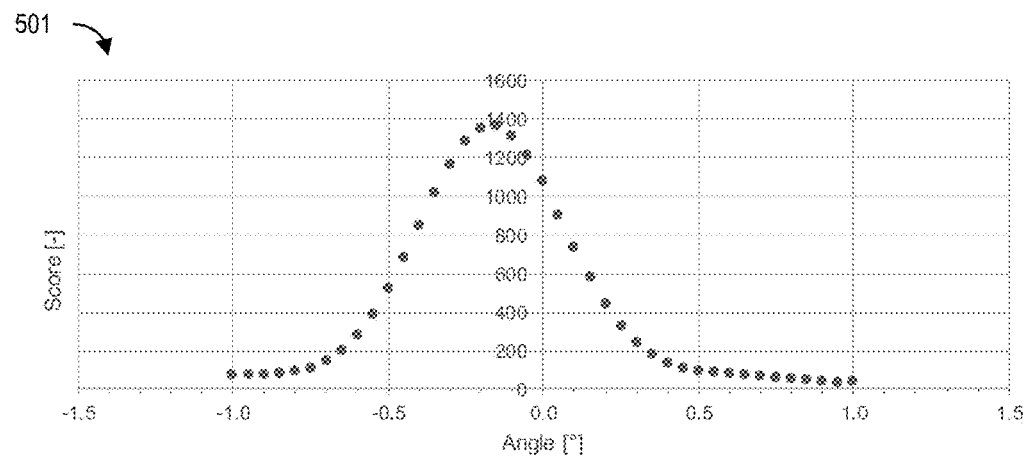
FIG. 5 is a representative plot of a statistical characterization of a plurality of integral transforms in accordance with an embodiment of the present disclosure.

FIG. 5 is a representative plot 501 of a statistical characterization of a plurality of integral transforms in accordance with an embodiment of the present disclosure. The plot 501 shows a score of each of a plurality of integral transforms, such as transforms 409A, B over a range of angles. The range of angles, for example, is from −1.5° to +1.5° as referenced to an initial position of the sample. Of course, other ranges of angles can be used and the values shown in plot 501 are for illustrative purposes only. As noted, the integral transforms may result in a vector of varying amplitudes, which may be obtained, for example, using the Radon Transform. A statistical characterization of each integral transform may be assigned as the score indicated in plot 501. The total scores may then be evaluated to look for a maximum, as shown, or a minimum, which associated value indicates the optimal orientation. For example, plot 501 shows a maximum score, as interpolated from the data points, e.g., dots, as around −0.15°. It should be noted that plotting the data as shown in plot 501 is not necessary and the same analysis could be implemented without using a visual representation of the data. The plot 501 is included for sake of illustration.

As noted above, the statistical characterization could be performed by calculating a standard deviation of each integral transform, or by calculating a variance thereof. In general, any statistical characterization could be used that qualitatively differentiates each integral transform in a way that indicates how blurry/clear each integral transform is.

FIG. 6 is an example method 601 for determining an optimal orientation of a sample in accordance with an embodiment of the present disclosure. The method 600 may be performed using a dual beam charged particle microscope, such as DB system 100 for example. Method 601 may begin at process block 603, which includes forming a reconstructed volume of a portion of a sample, the sample including a plurality of structures, and the reconstructed volume including a portion of the plurality of structures. In some embodiments, the reconstructed volume may be obtained using the slice-and-view process outlined in workflow 201, for example. The process includes removing a relatively thin volume from the sample so that the integral transforms and statistical analysis can be performed. In general, only enough of the sample needs to be removed to perform the disclosed technique, but the removal should not result in removing the structures that need to remain in the target lamella.

Process block 303 may be followed by process block 305, which includes performing, over a range of angles, a mathematical transform on each plane of a plurality of planes of the reconstructed volume. The transform may use the radon transform at a plurality of different angles within a range of angles, where the range of angles is centered on the current orientation of the sample to an ion beam, such as ion beam 118. In some embodiments, each plane of the plurality of planes is subjected to the transform at each of the plurality of angles of the range of angles. In other embodiments, each plane of the plurality of planes is subject to one angle in the plurality of angles. In either embodiment, the end result is a plurality of transforms at each angle within the range of angles that provides data for the range of angles.

Process block 305 may be followed by process block 307, which includes determining a target orientation of the sample within the range of angles based on the mathematical transform on each plane of the plurality of planes, wherein the target orientation aligns the plurality of structures parallel to an optical axis of a charged particle beam. The determination of the target orientation includes performing a statistical analysis on the plurality of transforms to determine the optimum orientation. For example, a standard deviation may be determined for each transform and the resulting set of standard deviation data, as shown in plot 501, may be analyzed to determine a maximum standard deviation. This maximum may indicate the optimum orientation. The maximum standard deviation may indicate the optimum orientation since the transform closest to the optimum orientation will have the clearest image/data that results in the maximum standard deviation. Alternatively, a plot of all the statistical data could be formed and an interpolation performed to identify the optimum angle, which may be between angles used for the transforms. In some embodiments, a variance is calculated instead of a standard deviation, but the end analysis should be the same.

Once the optimum orientation is determined, which may be a rotation, a tilt, or a combination thereof, the optimum orientation is provided by to a controller, such as controller 119, so that the sample is automatically moved to the optimum orientation.

Figure 7:
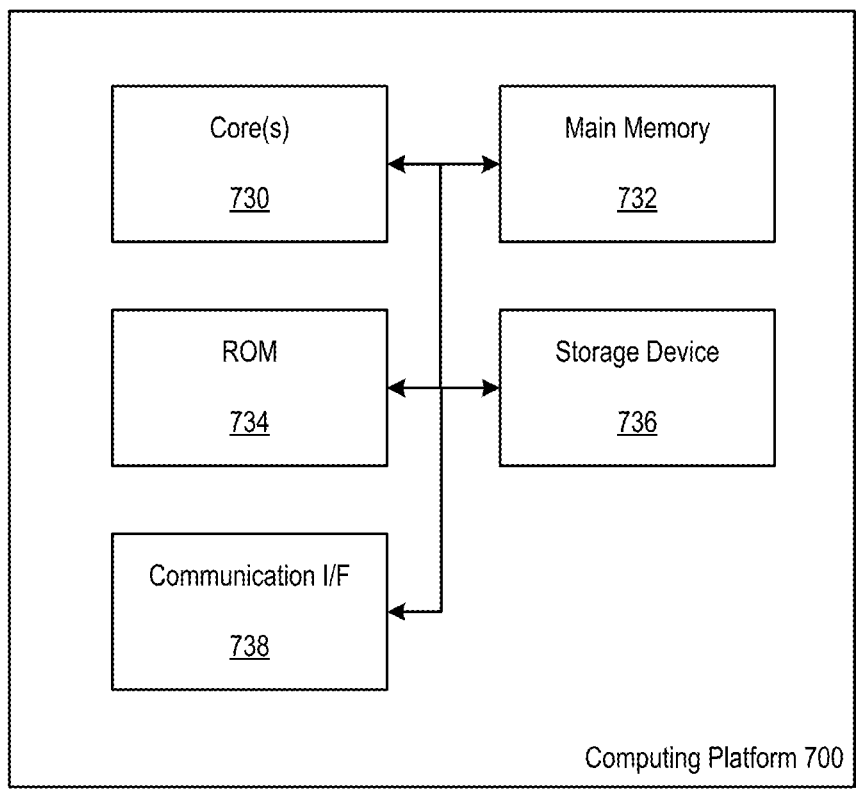
FIG. 7 is an example functional block diagram in accordance with an embodiment of the present disclosure.

FIG. 7 is an example functional block diagram 700 in accordance with an embodiment of the present disclosure. FIG. 7 is a block diagram that illustrates a computer system 700 that can be used to implement an embodiment of the present disclosure. The computing system 700 may be an example of computing hardware included with system 100 and/or EM 200, such controller 30/230, and which may incorporate memory 32 and be coupled to display 31 and user input device 33, for example. Computer system 700 at least includes a hardware processor, such as core(s) 730 for processing information, which may be coupled to a communication bus. The computing system 700 may be used to implement the methods and techniques disclosed herein, such as method 301, and may also be used to obtain images based on the synchronization of the scanning of the sample with the pulse period of a pulsed electron beam.

Computer system 700 also includes a main memory 732, such as a random access memory (RAM) or other dynamic storage device, coupled to a bus for storing information and instructions to be executed by core(s) 730. Main memory 732 also may be used for storing temporary variables or other intermediate information during execution of instructions to be executed by core 730. Such instructions, when stored in non-transitory storage media accessible to core 730, render computer system 700 into a special-purpose machine that is customized to perform the operations specified in the instructions. Main memory 732 may be memory 32 or separate from memory 32.

Computer system 700 further includes a read only memory (ROM) 734 or other static storage device coupled to the bus for storing static information and instructions for core 730. A storage device 736, such as a magnetic disk or optical disk, is provided and coupled to the bus for storing information and instructions.

Computer system 700 may be coupled via the bus to a display, such as display 31, for displaying information to a computer user. An input device 33, including alphanumeric and other keys, is coupled to the bus for communicating information and command selections to core 730. Another type of user input device is cursor control, such as a mouse, a trackball, or cursor direction keys for communicating direction information and command selections to core 730 and for controlling cursor movement on the display. This input device typically has two degrees of freedom in two axes, a first axis (e.g., x) and a second axis (e.g., y), that allows the device to specify positions in a plane.

Computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to core(s) 730 executing one or more sequences of one or more instructions contained in main memory 732. Such instructions may be read into main memory 732 from another storage medium, such as storage device 736. Execution of the sequences of instructions contained in main memory 732 causes core 730 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media.

Non-volatile media includes, for example, optical or magnetic disks, such as storage device 736. Volatile media includes dynamic memory, such as main memory 732. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 640. Transmission media can also take the form of acoustic or light waves, such as those generated during radio-wave and infra-red data communications.

Various forms of media may be involved in carrying one or more sequences of one or more instructions to core 730 for execution. For example, the instructions may initially be carried on a magnetic disk or solid state drive of a remote computer. The remote computer can load the instructions into its dynamic memory and send the instructions over a network.

Computer system 700 also includes a communication interface 738 coupled to the bus. Communication interface 738 provides a two-way data communication coupling to a network link (not shown) that is connected to a local network. For example, communication interface 738 may be an integrated services digital network (ISDN) card, cable modem, satellite modem, or a modem to provide a data communication connection to a corresponding type of telephone line. As another example, communication interface 738 may be a local area network (LAN) card to provide a data communication connection to a compatible LAN. Wireless links may also be implemented. In any such implementation, communication interface 738 sends and receives electrical, electromagnetic or optical signals that carry digital data streams representing various types of information.

Computer system 700 can send messages and receive data, including program code, through network(s), a network link and communication interface 738. In the Internet example, a server might transmit a requested code for an application program through the Internet 666 via an ISP, local network and/or communication interface 738.

The received code may be executed by core 730 as it is received, and/or stored in storage device 736, or other non-volatile storage for later execution.

The embodiments discussed herein to illustrate the disclosed techniques should not be considered limiting and only provide examples of implementation. Those skilled in the art will understand the other myriad ways of how the disclosed techniques may be implemented, which are contemplated herein and are within the bounds of the disclosure.

What is claimed is:

1. A method comprising:
    forming a reconstructed volume of a portion of a sample, the sample including a plurality of structures, and the reconstructed volume including a portion of the plurality of structures;
    performing, over a range of angles, a mathematical transform on each plane of a plurality of planes of the reconstructed volume; and
    based on the mathematical transform on each plane of the plurality of planes, determining a target orientation of the sample within the range of angles, wherein the target orientation aligns the plurality of structures parallel to an optical axis of a charged particle beam.

2. The method of claim 1, wherein performing, over a range of angles, a mathematical transform on each plane of a plurality of planes includes:
    performing a mathematical transform on each plane of the plurality of planes at a plurality of angels of the range of angles for each plane.

3. The method of claim 1, wherein performing, over a range of angles, a mathematical transform on each plane of a plurality of planes includes:
    performing a mathematical transform on each plane of the plurality of planes at a different angle of the range of angles for each plane.

4. The method of claim 1, wherein performing, over a range of angles, a mathematical transform on each plane of a plurality of planes includes:

performing, over the range of angles, a radon transform on each plane of the plurality of planes.

5. The method of claim 4, wherein performing, over the range of angles, a radon transform on each plane of the plurality of planes includes:

performing the radon transform on each plane of the plurality of planes at a plurality of angels of the range of angles for each plane.

6. The method of claim 1, further including:

performing a statistical characterization of each mathematical transform on each plane of the plurality of planes, wherein a range of statistical characterization data is formed over the range of angles.

7. The method of claim 6, further including:

analyzing the range of statistical data for a maximum value, wherein the maximum value indicates the target orientation.

8. The method of claim 6, wherein the statistical characterization includes a standard deviation.

9. The method of claim 6, wherein the statistical characterization includes a variance.

10. The method of claim 1, wherein forming reconstructed volume of a portion of a sample, the reconstructed volume including a plurality of structures includes:

acquiring an image of a face of the sample;

removing a slice of the sample;

acquiring an image of a newly exposed face of the sample, the newly exposed face exposed from the slice removal; and repeating the image acquisition and slice removal steps a plurality of times.

11. An apparatus comprising:

a focused ion beam column coupled to provide an ion beam along an optical axis;

an electron beam column coupled to provide an electron beam; and a controller coupled to or including non-transitory memory including code that, when executed by the controller, causes the apparatus to;

form, using a combination of the ion beam and the electron beam, a reconstructed volume of a portion of a sample, the sample including a plurality of structures, and the reconstructed volume including a portion of the plurality of structures;

perform, over a range of angles, a mathematical transform on each plane of a plurality of planes of the reconstructed volume; and based on the mathematical transform on each plane of the plurality of planes, determine a target orientation of the sample within the range of angles, wherein the target orientation aligns the plurality of structures parallel to an optical axis of a charged particle beam.

12. The apparatus of claim 11, wherein the code that causes the apparatus to perform, over a range of angles, a mathematical transform on each plane of a plurality of planes further includes code that, when executed by the controller, causes the apparatus to:

perform a mathematical transform on each plane of the plurality of planes at a plurality of angels of the range of angles for each plane.

13. The apparatus of claim 11, wherein the code that causes the apparatus to perform, over a range of angles, a mathematical transform on each plane of a plurality of planes further includes code that, when executed by the controller, causes the apparatus to:

perform a mathematical transform on each plane of the plurality of planes at a different angle of the range of angles for each plane.

14. The apparatus of claim 11, wherein the code that causes the apparatus to perform, over a range of angles, a mathematical transform on each plane of a plurality of planes further includes code that, when executed by the controller, causes the apparatus to:

perform, over the range of angles, a radon transform on each plane of the plurality of planes.

15. The apparatus of claim 14, wherein the code that causes the apparatus to perform, over the range of angles, a radon transform on each plane of the plurality of planes further includes code that, when executed by the controller, causes the apparatus to:

perform the radon transform on each plane of the plurality of planes at a plurality of angels of the range of angles for each plane.

16. The apparatus of claim 11, wherein the non-transitory memory includes code that, when executed by the controller, causes the apparatus to:

perform a statistical characterization of each mathematical transform on each plane of the plurality of planes, wherein a range of statistical characterization data is formed over the range of angles.

17. The apparatus of claim 16, wherein the code that causes the apparatus to perform a statistical characterization of each mathematical transform on each plane of the plurality of planes further includes code that, when executed by the controller, causes the apparatus to:

analyze the range of statistical data for a maximum value, wherein the maximum value indicates the target orientation.

18. The apparatus of claim 16, wherein the statistical characterization includes a standard deviation.

19. The apparatus of claim 16, wherein the statistical characterization includes a variance.

20. The apparatus of claim 11, wherein the non-transitory memory includes code that, when executed by the controller, causes the apparatus to:

acquire an image of a face of the sample;

remove a slice of the sample;

acquire an image of a newly exposed face of the sample, the newly exposed face exposed from the slice removal; and repeat the image acquisition and slice removal steps a plurality of times.

* * * * *